(12) United States Patent
Salcedo et al.

(10) Patent No.: US 10,404,059 B2
(45) Date of Patent: Sep. 3, 2019

(54) DISTRIBUTED SWITCHES TO SUPPRESS TRANSIENT ELECTRICAL OVERSTRESS-INDUCED LATCH-UP

(71) Applicant: ANALOG DEVICES, INC., Norwood, MA (US)

(72) Inventors: Javier Alejandro Salcedo, North Billerica, MA (US); Srivatsan Parthasarathy, Acton, MA (US); Linfeng He, Orlando, FL (US); Yuanzhong Zhou, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 252 days.

(21) Appl. No.: 15/428,535

(22) Filed: Feb. 9, 2017

(65) Prior Publication Data

US 2018/0226788 A1   Aug. 9, 2018

(51) Int. Cl.
*H02H 7/20* (2006.01)
*H01L 23/528* (2006.01)
*H01L 27/02* (2006.01)
*H01L 27/092* (2006.01)

(52) U.S. Cl.
CPC ......... *H02H 7/205* (2013.01); *H01L 23/5286* (2013.01); *H01L 27/0248* (2013.01); *H01L 27/0262* (2013.01); *H01L 27/0921* (2013.01)

(58) Field of Classification Search
CPC .. H02H 7/205; H01L 23/5286; H01L 27/0248
See application file for complete search history.

(56) References Cited

U.S. PATENT DOCUMENTS

| 6,028,341 | A  | 2/2000  | Tai et al. |
| 7,285,828 | B2 | 10/2007 | Salcedo et al. |
| 7,566,914 | B2 | 7/2009  | Salcedo et al. |
| 7,601,991 | B2 | 10/2009 | Salcedo et al. |
| 7,663,853 | B2 | 2/2010  | Ker et al. |
| 7,817,388 | B2 | 10/2010 | Chiu et al. |
| 8,044,457 | B2 | 10/2011 | Salcedo et al. |
| 8,222,698 | B2 | 7/2012  | Salcedo et al. |
| 8,222,700 | B2 | 7/2012  | Gehle et al. |
| 8,320,091 | B2 | 11/2012 | Salcedo et al. |
| 8,368,116 | B2 | 2/2013  | Salcedo et al. |

(Continued)

OTHER PUBLICATIONS

Lu et al., "Novel Insights into the Power-off and Power-on Transient Performance of Power-rail ESD Clamp Circuit", IEEE Xplore, Oct. 18, 2016, 7 pages.

*Primary Examiner* — Scott Bauer
(74) *Attorney, Agent, or Firm* — Knobbe, Martens, Olson & Bear, LLP

(57) ABSTRACT

Distributed switches to suppress transient electrical overstress-induced latch-up are provided. In certain configurations, an integrated circuit (IC) or semiconductor chip includes a transient electrical overstress detection circuit that activates a transient overstress detection signal in response to detecting a transient electrical overstress event between a pair of power rails. The IC further includes mixed-signal circuits and latch-up suppression switches distributed across the IC, and the latch-up suppression switches temporarily clamp the power rails to one another in response to activation of the transient overstress detection signal to inhibit latch-up of the mixed-signal circuits.

20 Claims, 10 Drawing Sheets

(56) References Cited

U.S. PATENT DOCUMENTS

| | | |
|---|---|---|
| 8,416,543 B2 | 4/2013 | Salcedo |
| 8,422,187 B2 | 4/2013 | Parthasarathy et al. |
| 8,432,651 B2 | 4/2013 | Salcedo et al. |
| 8,466,489 B2 | 6/2013 | Salcedo et al. |
| 8,553,380 B2 | 10/2013 | Salcedo |
| 8,564,065 B2 | 10/2013 | Donovan et al. |
| 8,592,860 B2 | 11/2013 | Salcedo et al. |
| 8,610,251 B1 | 12/2013 | Salcedo |
| 8,637,899 B2 | 1/2014 | Salcedo |
| 8,665,571 B2 | 3/2014 | Salcedo et al. |
| 8,680,620 B2 | 3/2014 | Salcedo et al. |
| 8,723,227 B2 | 5/2014 | Salcedo et al. |
| 8,796,729 B2 | 8/2014 | Clarke et al. |
| 8,860,080 B2 | 10/2014 | Salcedo |
| 8,946,822 B2 | 2/2015 | Salcedo et al. |
| 8,947,841 B2 | 2/2015 | Salcedo et al. |
| 8,958,187 B2 | 2/2015 | Parthasarathy et al. |
| 9,006,781 B2 | 4/2015 | Salcedo et al. |
| 9,088,256 B2 | 7/2015 | Cosgrave et al. |
| 9,123,540 B2 | 9/2015 | Salcedo et al. |
| 9,147,677 B2 | 9/2015 | Salcedo et al. |
| 9,171,832 B2 | 10/2015 | Salcedo et al. |
| 9,184,098 B2 | 11/2015 | Salcedo et al. |
| 9,275,991 B2 | 3/2016 | Salcedo et al. |
| 9,293,912 B2 | 3/2016 | Parthasarathy et al. |
| 9,478,608 B2 | 10/2016 | Salcedo et al. |
| 9,634,482 B2 | 4/2017 | Parthasarathy et al. |
| 2008/0044955 A1* | 2/2008 | Salcedo .............. H01L 27/0262 438/140 |
| 2013/0141823 A1* | 6/2013 | Di Sarro ................ H02H 9/046 361/56 |
| 2013/0265677 A1* | 10/2013 | Prabhu .................. H02H 9/046 361/56 |
| 2016/0204096 A1 | 7/2016 | Zhao et al. |
| 2016/0261110 A1 | 9/2016 | Ivanov et al. |
| 2016/0285255 A1 | 9/2016 | O'Donnell et al. |
| 2016/0300830 A1 | 10/2016 | Salcedo et al. |
| 2016/0336740 A1 | 11/2016 | Parthasarathy et al. |
| 2016/0336744 A1 | 11/2016 | Parthasarathy et al. |
| 2017/0243862 A1 | 8/2017 | Parthasarathy et al. |
| 2017/0256534 A1 | 9/2017 | Parthasarathy et al. |
| 2017/0317070 A1 | 11/2017 | Salcedo et al. |
| 2017/0366002 A1 | 12/2017 | Zhao et al. |
| 2018/0026440 A1 | 1/2018 | Zhao et al. |
| 2018/0211951 A1 | 7/2018 | Luo et al. |

\* cited by examiner

DISTRIBUTED SWITCHES TO SUPPRESS TRANSIENT ELECTRICAL OVERSTRESS-INDUCED LATCH-UP

FIELD OF THE DISCLOSURE

Embodiments of the invention relate to electronic systems, and more particularly, to systems and devices for transient electrical overstress protection and latch-up prevention.

BACKGROUND

Certain electronic systems can be exposed to electrical overstress events, or electrical signals of short duration having rapidly changing voltage and high power. Electrical overstress events can include, for example, electrostatic discharge (ESD) events arising from the abrupt release of charge from an object or person to an electronic system.

Electrical overstress events can damage or destroy integrated circuits (ICs) by generating overvoltage conditions and high levels of power dissipation in relatively small areas of the ICs. High power dissipation can increase IC temperature, and can lead to numerous problems, such as gate oxide punch-through, junction damage, metal damage, and surface charge accumulation.

SUMMARY OF THE DISCLOSURE

Distributed switches to suppress transient electrical overstress-induced latch-up are provided. In certain configurations, an integrated circuit (IC) or semiconductor chip includes a transient electrical overstress detection circuit that activates a transient overstress detection signal in response to detecting a transient electrical overstress event between a pair of power rails. The IC further includes mixed-signal circuits and latch-up suppression switches distributed across the IC, and the latch-up suppression switches temporarily clamp the power rails to one another in response to activation of the transient overstress detection signal to inhibit latch-up of the mixed-signal circuits.

In one aspect, an integrated circuit is provided. The integrated circuit includes a first power rail, a second power rail, one or more electrical overstress detection circuits configured to activate at least one transient overstress detection signal in response to detecting a transient electrical overstress event between the first power rail and the second power rail, a plurality of distributed mixed-signal circuits powered by the first power rail and the second power rail, and a plurality of distributed latch-up suppression switches electrically connected between the first power rail and the second power rail. Additionally, when the integrated circuit is powered, the plurality of distributed latch-up suppression switches are operable to clamp the first power rail and the second power rail in response to activation of the at least one transient overstress detection signal to inhibit latch-up of the plurality of distributed mixed-signal circuits.

In another aspect, a method of inhibiting latch-up in an integrated circuit is provided. The method includes powering a mixed-signal circuit using a first power rail and a second power rail, activating a transient overstress detection signal in response to detecting a transient electrical overstress event between the first power rail and the second power rail, turning on a latch-up suppression switch that is electrically connected between the first power rail and the second power rail in response to activation of the transient overstress detection signal, and suppressing latch-up in the mixed-signal circuit by clamping the first power rail and the second power rail using the latch-up suppression switch.

In another aspect, an interface for a semiconductor chip is provided. The interface includes a first interface pad, a second interface pad, an electrical overstress detection circuit configured to activate a transient overstress detection signal in response to detecting a transient electrical overstress event between the first power rail and the second power rail, a mixed-signal circuit configured to receive power from the first interface pad and the second interface pad, and a latch-up suppression switch electrically connected between the first interface pad the second interface pad. The latch-up suppression switch is operable to clamp the first interface pad and the second interface pad in response to activation of the transient overstress detection signal to inhibit latch-up of the mixed-signal circuit.

DETAILED DESCRIPTION

Figure 1:
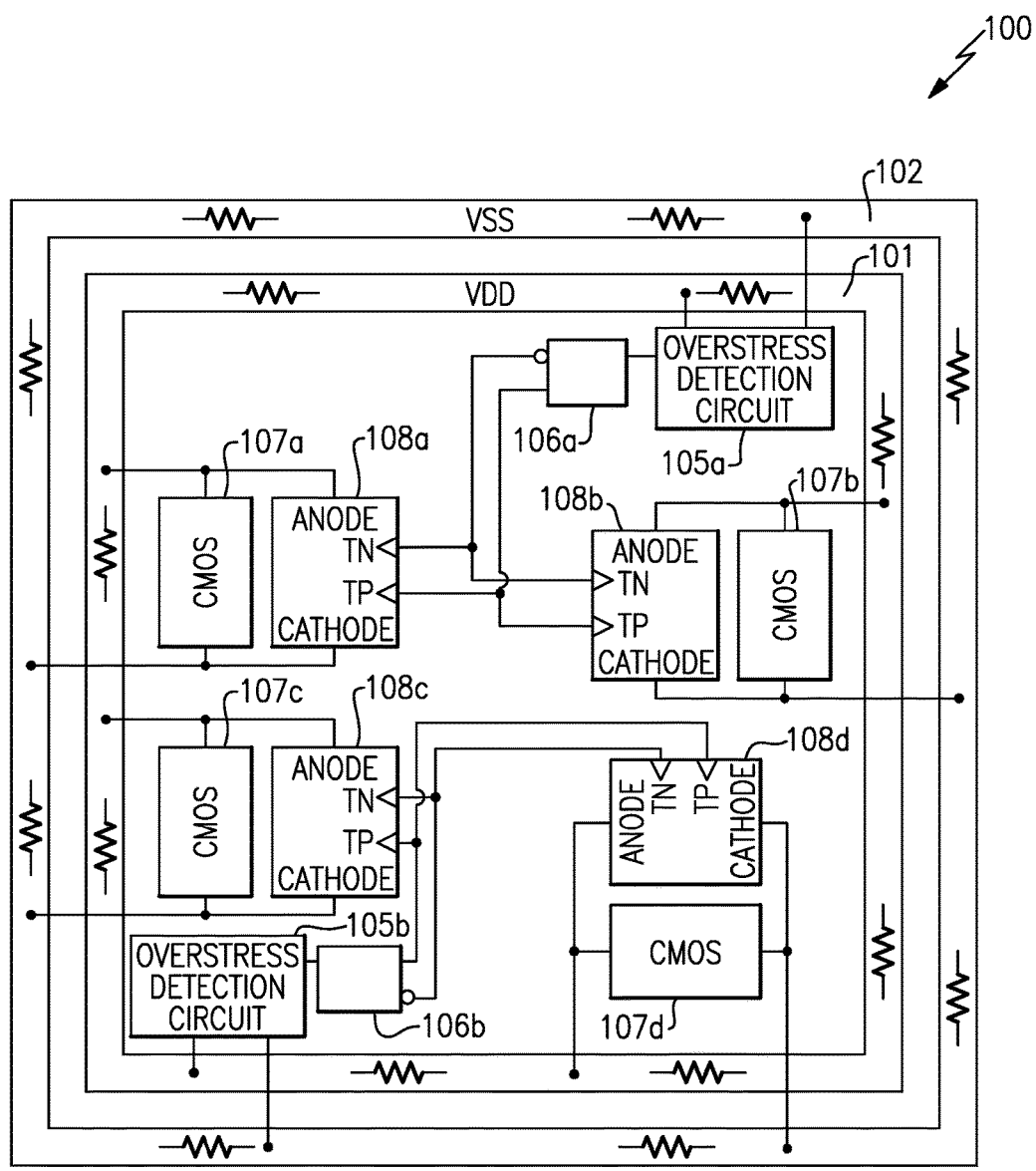
FIG. 1 is a schematic diagram of an integrated circuit (IC) including distributed latch-up suppression switches according to one embodiment.

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Certain electronic systems include electrical overstress protection circuits to protect circuits or components from transient electrical overstress events. To help guarantee that an electronic system is reliable, manufacturers can test the electronic system under defined stress conditions, which can be described by standards set by various organizations, such as the Joint Electronic Device Engineering Council (JEDEC), the International Electrotechnical Commission (IEC), and the Automotive Engineering Council (AEC). The standards can cover a wide multitude of transient electrical overstress events, including electrostatic discharge (ESD) events.

Latch-up can be induced from transient electrical overstress conditions on a semiconductor chip or IC. In one example, transient electrical overstress causes transient high current injection into an IC's substrate, which can lead to current-induced triggering of parasitic bipolar devices present in layouts of complementary metal oxide semiconductor (CMOS) mixed-signal circuits. In another example, latch-up can arise in CMOS mixed-signal circuits from transient overvoltage due to inductive effects of the IC's power supply network. The susceptibility of CMOS mixed-signal circuits to latch-up can lead to complexity in layout of core mixed-signal circuitry, and has been a leading cause of design failures in mission critical applications.

Although latch-up risk can be mitigated by using stringent layout design rules (for example, large spacing requirements), such design rules negatively impact core circuit performance and area.

In certain configuration herein, an IC includes an electrical overstress detection circuit that activates a transient overstress detection signal in response to detecting a transient electrical overstress event between a pair of power rails. The IC further includes mixed-signal circuits and latch-up suppression switches distributed or spread out across the IC, and the latch-up suppression switches clamp the power rails in response to activation of the transient overstress detection signal to inhibit latch-up of the mixed-signal circuits.

Accordingly, the latch-up suppression switches are activated in response to detection of transient electrical overstress, thereby providing latch-up protection to nearby mixed-signal circuits. For example, the latch-up suppression switches can be connected between the power rails of an IC and positioned near CMOS core mixed-signal circuits. Additionally, the latch-up suppression switches inhibit electrical overstress from causing large currents to be injected into CMOS layouts and/or limit overvoltage of power rails that provide a supply voltage and a ground voltage to nearby CMOS core mixed-signal circuitry.

The latch-up suppression switches operate with fast response or turn-on, and thus can provide latch-up protection even when a power clamp or other ESD protection device with higher current handling capability has yet to be activated. Thus, the latch-up suppression switches can serve as components in a larger electrical overstress protection system. Additionally, the latch-up suppression switches can be implemented with relatively small footprint or layout area, and thus are suitable for integration near or in the layouts of CMOS core mixed-signal circuits.

The latch-up suppression switches are actively controlled by the electrical overstress detection circuit, which provides active control for rapid switch turn-on and subsequent switch turn-off. By providing active control, an on-state condition of the latch-up suppression switches is modified. For example, the latch-up suppression switches can operate temporarily with relatively low activation and holding voltages. Additionally, after the stress is discharged, active control terminates and the latch-up suppression switches are released such that the power rails return to their normal operating voltage levels.

In certain implementations, the latch-up suppression switches are implemented using thyristors. For example, distributed thyristor switches can be used to keep a low clamping voltage during an electrical overstress condition, thereby preventing or suppressing breakdown-induced latch-up in CMOS core mixed-signal circuitry. The thyristors are actively controlled to initiate and interrupt regenerative feedback. For example, trigger signals can be provided to the one or more bases of a coupled pair of PNP and NPN bipolar transistors of each thyristor, thereby controlling carrier multiplication and/or recombination processes associated with regenerative feedback of the coupled pair.

The latch-up suppression switches can be distributed throughout different regions of the IC. When activated, the latch-up suppression switches prevent nearby CMOS core mixed-signal circuits from a latch-up condition. Moreover, the latch-up suppression switches can also assist in providing a temporary low voltage clamping function during high transient electrical overstress.

The teachings herein can be used in a wide variety of applications, including, but not limited to, industrial, instrumentation, energy, healthcare, automation/control, and automotive communication/diagnostic applications. For example, emerging mission critical applications for industrial, instrumentation, and/or automotive applications can be specified to tolerate stress conditions that are much higher than typical latch-up robustness characterization.

FIG. 1 is a schematic diagram of an IC 100 including distributed latch-up suppression switches according to one embodiment. The IC 100 includes a first power rail 101, a second power rail 102, a first electrical overstress detection circuit 105a, a second electrical overstress detection circuit 105b, a first driver circuit 106a, a second driver circuit 106b, first to fourth CMOS core mixed-signal circuits 107a-107d, respectively, and first to fourth latch-up suppression switches 108a-108d, respectively.

Although one specific embodiment of an IC is shown in FIG. 1, the teachings herein are applicable to ICs implemented in a wide variety of ways, including, but not limited to, ICs implemented with more or fewer electrical overstress detection circuits and/or latch-up suppression circuits. Accordingly, although FIG. 1 illustrates one specific implementation of an IC, other IC implementations are possible.

In the illustrated embodiment, the first power rail 101 corresponds to a supply voltage rail (VDD), and the second power rail 102 corresponds to a ground rail (VSS). However, the teachings here can be used to provide latch-up suppression to other power domains. Accordingly, other implementations are possible.

Moreover, in implementations in which the IC 100 includes multiple power domains, similar circuitry can be replicated to provide latch-up suppression to each power domain. For example, electrical overstress detection circuits can be provided for each power domain of concern, and used to control associated latch-up suppression switches.

In the illustrated embodiment, the first power rail 101 and the second power rail 102 are schematically depicted as rings. However, a power rail can be implemented in a wide variety of ways. Moreover, a power rail can include conductors on multiple metallization layers of an IC. As shown in FIG. 1, the power rails 101-102 include parasitic resistors.

With continuing reference to FIG. 1, the first overstress detection circuit 105a provides a first transient overstress detection signal to the first driver circuit 106a, which buffers the first transient overstress detection signal to generate a pair of trigger signals that are distributed to the latch-up suppression switches 108a-108b. Similarly, the second overstress detection circuit 105b provides a second transient overstress detection signal to the second driver circuit 106b, which buffers the second transient overstress detection signal to generate another pair of trigger signals that are distributed to the latch-up suppression switches 108c-108d.

Including one or more driver circuits, such as the first and second driver circuits 106a-106b, aids in providing sufficient drive strength to distribute triggers signals to several latch-up suppression switches and/or over large physical distances. Additionally, in the illustrated embodiment, each of the driver circuits 106a-106b also processes a transient overstress detection signal to generate a pair of complementary trigger signals of opposite logical value. Thus, in some implementations, a driver circuit can be used to perform logical operations on a transient overstress detection signal to obtain one or more trigger signals of desired signal polarity.

Although a specific implementation of driver circuits is shown, other configurations are possible. In one example, a driver circuit is implemented as a tree of inverters or other circuits used to provide trigger signal distribution across chip. In another example, driver circuits are omitted in favor of providing one or more trigger signals directly from an electrical overstress detection circuit to one or more latch-up suppression switches.

In the illustrated embodiment, each of the latch-up suppression switches 108a-108d includes an anode terminal electrically connected to the first power rail 101, a cathode terminal electrically connected to the second power rail 102, a first trigger terminal (TN) that receives a first trigger signal, and a second trigger terminal (TP) that receives a second trigger signal. Thus, in this example, the latch-up suppression switches 108a-108d each receive two trigger signals that control switch triggering and clamping between the power rails 101-102. Although the illustrated embodiment provides two trigger signals to each of the latch-up suppression switches 108a-108d, the teachings herein are applicable to implementations using more or fewer trigger signals.

The electrical overstress detection circuits 105a-105b are used to monitor the first and second power rails 101-102 to actively detect for the presence of a transient electrical overstress condition. In certain implementations, the electrical overstress detection circuits 105a-105b monitor for presence of an ESD event, and thus serve as ESD detection circuits.

Including the electrical overstress detection circuits 105a-105b aids in detecting transient electrical overstress conditions relatively quickly. Additionally, in response to detecting a transient electrical overstress condition, the electrical overstress detection circuits 105a-105b activate detection signals, which the driver circuits 106a-106b distribute as trigger signals to the latch-up suppression switches 108a-108d. This in turn, results in activation of the latch-up suppression switches 108a-108d and inhibits latch-up from occurring in the CMOS core mixed-signal circuits 107a-107d.

Accordingly, in the illustrated embodiment, electrical overstress detection circuits 105a-105b are used to monitor the voltage conditions of the first and second power rails 101-102, thereby identifying a fast transient rise time associated with a transient electrical overstress event. In response to detection of a transient electrical overstress condition, the electrical overstress detection circuits 105a-105b activate transient overstress detection signals that result in the distributed latch-up suppression switches 108a-108d turning on to clamp the power rails 101-102. After passage of the transient electrical overstress condition, the electrical overstress detection circuits 105a-105b deactivate the transient overstress detection signals, and the latch-up suppression switches 108a-108d turn off.

Although not illustrated in FIG. 1, a power clamp (for instance, the power clamp 209 of FIG. 4A) or other ESD protection device with high current handling capability can be included to discharge electrical overstress between the first power rail 101 and the second power rail 102. Additionally, the latch-up suppression switches 108a-108d are used to inhibit latch-up from occurring in the CMOS core mixed-signal circuits 107a-107d due to high voltage and/or high current conditions arising from a delay in activation of the power clamp. For example, as will be described in detail below with respect to FIGS. 6A-6D, a delay in activation of a power clamp combined with non-idealities in a power supply network can result in high currents and/or overvoltage leading to latch-up.

In contrast, including the latch-up suppression switches 108a-108d provides localized latch-up protection to the CMOS core mixed-signal circuits 107a-107d, thereby inhibiting latch-up until the power clamp activates and the power rails 101-102 are restored to nominal voltage levels.

Including the electrical overstress detection circuits 105a-105b aids in decoupling overstress detection and latch-up protection, thereby enhancing flexibility and speed. Moreover, the latch-up suppression switches 108a-108d serve as discharge cells that can be distributed across the chip layout, including, for example, adjacent to and/or in CMOS core mixed-signal circuit layouts. In one embodiment, a latch-up suppression switch is positioned within about 50 μm of a layout of a CMOS core mixed-signal circuit. However, other distances are possible, such as distances that depend on a distributed resistance of power rails.

In the illustrated embodiment, multiple electrical overstress detection circuits are provided. Including multiple overstress detection circuits can aid in providing faster detection of a transient electrical overstress condition that causes higher voltage conditions in one region of the power rails relative to another. For instance, the resistive and/or inductive effects associated with a power supply network can lead to voltage drops and different electrical potentials at different positions along the power rails.

When multiple electrical overstress detection circuits are included, a particular latch-up suppression switch can receive one or more trigger signals from a particular electrical overstress detection circuit, for instance, a closest electrical overstress detection circuit. Although an implementation with multiple electrical overstress detection circuits is shown, other configurations are possible, including, but not limited to, implementations using a single electrical overstress detection circuit and implementations using an electrical overstress detection circuit for each latch-up suppression switch.

In certain configurations, the latch-up suppression switches 108a-108d are implemented using bipolar transistors. For example, in one embodiment, each latch-up suppression switch includes an NPN bipolar transistor and a PNP bipolar transistor that are cross-coupled with one another to form a Silicon-controlled rectifier (SCR) or thyristor. Thyristors and other bipolar transistor switches can provide higher current density relative to MOS transistor switches. Accordingly, using bipolar transistors as switches reduces a total layout area of latch-up suppression switches, and thus servers as a smaller and more viable solution for integration near or in CMOS core mixed-signal circuitry.

In the illustrated embodiment, one latch-up suppression switch is positioned adjacent to each CMOS core mixed-signal circuit. However, other implementations are possible. For example, the CMOS core mixed-signal circuits can include analog CMOS circuits and multiple CMOS gates and latches, and one or more latch-up suppression switches can be integrated in or near the layout of the CMOS core mixed-signal circuit.

In one example, a CMOS core mixed-signal circuit includes an analog portion and a digital portion that includes a place-and-route block. Additionally, one or more latch-up suppression switches are included as cells in the place-and-route block and/or adjacent to a boundary or perimeter of the place-and-route block.

Figure 2A:
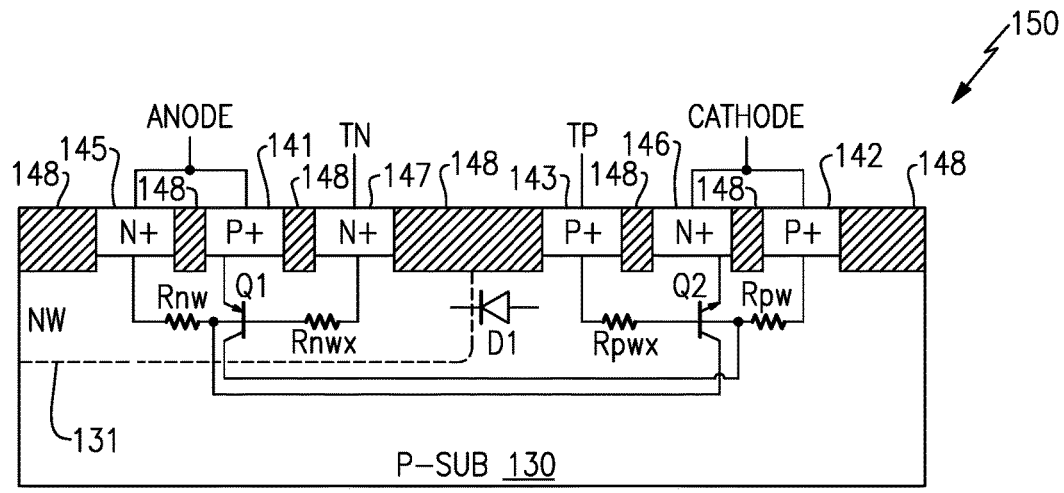
FIG. 2A is an annotated cross-section of a latch-up suppression switch according to one embodiment.

FIG. 2A is an annotated cross-section of a latch-up suppression switch 150 according to one embodiment.

Although one specific implementation of a latch-up suppression switch is shown in FIG. 2A, the teachings herein are applicable to latch-up suppression switches implemented in a wide variety of ways.

The illustrated latch-up suppression switch 150 of FIG. 2A is fabricated in a p-type substrate (P-SUB) 130, and includes an n-type well (NW) 131, an anode p-type active (P+) region 141, a cathode P+ region 142, a trigger P+ region 143, an anode n-type active (N+) region 145, a cathode N+ region 146, a trigger N+ region 147, and shallow trench isolation (STI) regions 148.

Although the latch-up suppression switch 150 of FIG. 2A illustrates one example of a latch-up suppression switch implemented in accordance with the teachings herein, a latch-up suppression switch can be implemented in a wide variety of ways, including, but not limited to, using different configurations of semiconductor wells and/or active regions. Accordingly, the teachings herein are applicable to other implementations of latch-up suppression switches.

As shown in FIG. 2A, the NW 131 is formed in the P-SUB 130. Additionally, the anode N+ region 145, the anode P+ region 141, and the trigger N+ region 147 are formed in the NW 131, with the anode P+ region 141 positioned between the anode N+ region 145 and the trigger N+ region 147. Additionally, the anode N+ region 145 and the anode P+ region 141 are electrically connected to an anode terminal (ANODE) of the switch 150 via metallization. Furthermore, the trigger N+ region 147 is electrically connected to a first trigger terminal (TN) via metallization.

In the illustrated embodiment, the trigger P+ region 143, the cathode N+ region 146, and the cathode P+ region 142 are formed in a portion of the P-SUB 130 that is adjacent to the NW 131. As shown in FIG. 2A, the cathode N+ region 146 is positioned between the trigger P+ region 143 and the cathode P+ region 142. The cathode N+ region 146 and the cathode P+ region 142 are electrically connected to a cathode terminal (CATHODE) of the switch 150 via metallization. Additionally, the trigger P+ region 143 is electrically connected to a second trigger terminal (TP) via metallization.

The electrical connections to the switch's terminals (ANODE, CATHODE, TP, and TN) are schematically depicted in FIG. 2A, and can correspond to electrical connections made using contacts and metallization during back end processing.

Although not illustrated in FIG. 2A, the P-SUB 130 includes other devices formed therein. For example, with respect to the IC 100 of FIG. 1, the P-SUB 130 includes a variety of circuitry formed therein, including the CMOS core mixed-signal circuits, driver circuits, and the latch-up suppression switches.

The illustrated embodiment includes STI regions 148. Formation of the STI regions 148 can include etching trenches in the P-SUB 130, filling the trenches with a dielectric, such as silicon dioxide ($SiO_2$), and removing the excess dielectric using any suitable method, such as chemical-mechanical planarization.

As shown in FIG. 2A, the NW 131 has a depth into the P-SUB 130 that is greater than a depth into the P-SUB 130 than both the STI regions 148 and the P+ and N+ active regions. Additionally, the STI regions 148 have a depth into the P-SUB 130 that is greater than that of the N+ and P+ regions. Furthermore, the N+ active regions have a higher n-type doping concentration than the NW 131, and the P+ active regions have a higher p-type doping concentration than the P-SUB 130.

The latch-up suppression switch 150 has been further annotated to show certain circuit devices present in the cross-section, including a PNP bipolar device Q1, an NPN bipolar device Q2, an NPN collector resistor Rnw, a PNP base resistor Rnwx, a PNP collector resistor Rpw, an NPN base resistor Rpwx, and a diode D1.

The PNP bipolar device Q1 includes an emitter formed from the anode P+ region 141, a base formed from the NW 131, and a collector formed from the P-SUB 130. The NPN bipolar device Q2 includes an emitter formed from the cathode N+ region 146, a base formed from the P-SUB 130, and a collector formed from the NW 131.

The NPN collector resistor Rnw is formed from a resistance of the NW 131 between the collector of the NPN bipolar transistor Q2 and the anode terminal. Additionally, the PNP base resistor Rnwx is formed from a resistance of the NW 131 between the base of the PNP bipolar transistor Q1 and the first trigger terminal TN. Furthermore, the PNP collector resistor Rpw is formed from a resistance of the P-SUB 130 between the collector of the PNP bipolar transistor Q1 and the cathode terminal. Furthermore, the NPN base resistor Rpwx is formed from a resistance of the P-SUB 130 between the base of the NPN bipolar transistor Q2 and the second trigger terminal TP.

The diode D1 includes an anode formed from the P-SUB 130 and a cathode formed from the NW 131.

During normal operating conditions between the anode terminal and the cathode terminal, the latch-up suppression switch 150 should be turned off and not conduct between the anode terminal and the cathode terminal. For example, the latch-up suppression switch 150 can be used during powered conditions of an IC in which the anode terminal is connected to a supply voltage rail (VDD) and the cathode terminal is connected to a ground rail (VSS). When no overstress condition is present, it is desirable for the latch-up suppression switch 150 to be turned off.

However, when a transient electrical overstress detection circuit (for instance, electrical overstress detection circuits 105a-105b of FIG. 1) detect an electrical overstress condition, it is desirable for the trigger signals received on the trigger terminals TN and TP to turn on the latch-up suppression switch 150. Turning on the latch-up suppression switch results in clamping of the anode terminal and the cathode terminal, which can reduce overvoltage conditions and high current injection into layouts of nearby CMOS core mixed-signal circuitry, thereby inhibiting latch-up.

After the transient electrical overstress event is discharged, the trigger signals receive on the trigger signals TN and TP are deactivated, thereby resulting in safe turn off of the latch-up suppression switch 150.

In the illustrated embodiment, the trigger N+ region 147 and the trigger P+ region 143 are located in a central region of the switch 150, and between the active regions associated with the switch's anode and cathode terminals.

By providing trigger control at the center of the switch 150, reduced input resistance to the base terminals of the NPN and PNP bipolar transistors is provided. For example, implementing the layout of the switch 150 in this manner provides relatively low values of the PNP base resistor Rnwx and the NPN base resistor Rpwx. Small resistance values of the PNP base resistor Rnwx and the NPN base resistor Rpwx contribute to rapid switch turn on time.

Moreover, triggering is provided in a region of the switch 150 in which carrier multiplication and/or recombination processes associated with regenerative feedback of the coupled PNP bipolar transistor Q1 and NPN bipolar transistor Q2 occurs. Thus, low-resistance trigger control at the center of the switch 150 facilitates activation and deactivation of switch conduction in a region in which regenerative feedback takes place, with a relatively small impact on switch on-state resistance.

Figure 2B:
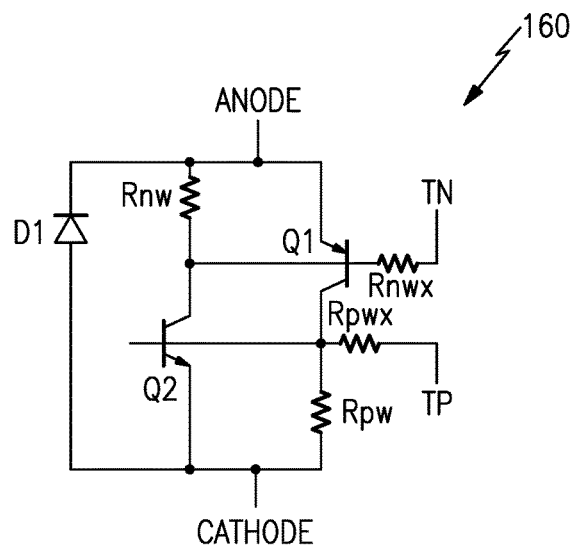
FIG. 2B is a circuit diagram of the latch-up suppression switch of FIG. 2A.

FIG. 2B is a circuit diagram 160 of the latch-up suppression switch 150 of FIG. 2A. The circuit diagram 160 includes the PNP bipolar device Q1, the NPN bipolar device Q2, the NPN collector resistor Rnw, the PNP base resistor Rnwx, the PNP collector resistor Rpw, the NPN base resistor Rpwx, and the diode D1.

As shown in FIG. 2B, the emitter of the PNP bipolar transistor Q1 is electrically connected to the anode terminal, and the collector of the PNP bipolar transistor Q1 is electrically connected to the cathode terminal via the PNP collector resistor Rpw. Additionally, the base of the PNP bipolar transistor Q1 is electrically connected to the collector of the NPN bipolar transistor Q2. Furthermore, the first trigger terminal TN is electrically connected to the base of the PNP bipolar transistor Q1 via the PNP base resistor Rnwx.

The emitter of the NPN bipolar transistor Q2 is electrically connected to the cathode terminal, and the collector of the NPN bipolar transistor Q2 is electrically connected to the anode terminal via the NPN collector resistor Rnw. Additionally, the base of the NPN bipolar transistor Q2 is electrically connected to the collector of the PNP bipolar transistor Q1. Furthermore, the second trigger terminal TP is electrically connected to the base of the NPN bipolar transistor Q2 via the NPN base resistor Rpwx.

As shown in FIG. 2B, the anode of the diode D1 is electrically connected to the cathode terminal, and the cathode of the diode D1 is electrically connected to the anode terminal.

Figure 3:
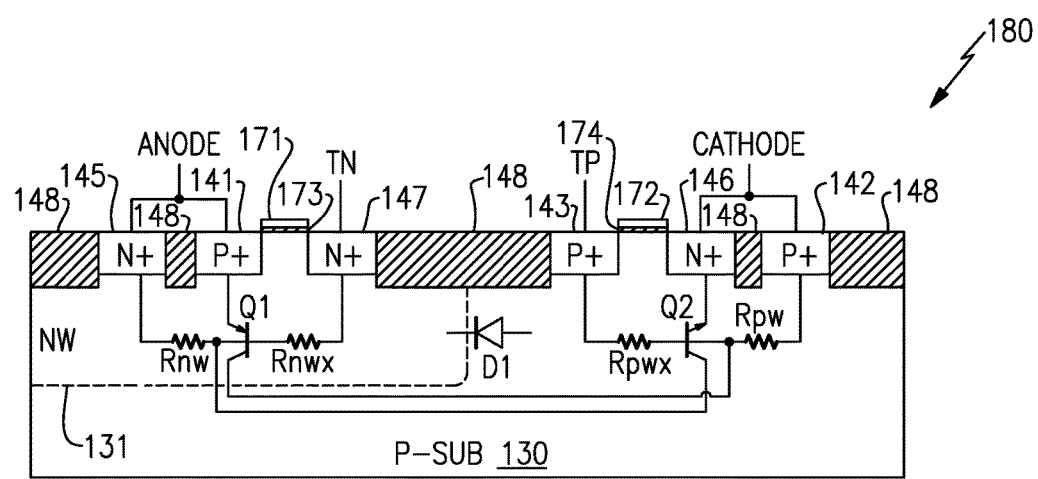
FIG. 3 is an annotated cross-section of a latch-up suppression switch according to another embodiment.

FIG. 3 is an annotated cross-section of a latch-up suppression switch 180 according to another embodiment. The latch-up suppression switch 180 is similar to the latch-up suppression switch 150 of FIG. 2A, except that the latch-up suppression switch 180 further includes an anode gate structure and a cathode gate structure for enhanced surface conduction that provides faster switch turn on speed.

In particular, an STI region is omitted between the anode P+ region 141 and the trigger N+ region 147 in favor of including an anode gate 171 and gate dielectric 173 over a portion of the NW 131 between the anode P+ region 141 and the trigger N+ region 147. Furthermore, an STI region is omitted between the cathode N+ region 146 and the trigger P+ region 143 in favor of including a cathode gate 172 and gate dielectric 174 over a portion of the P-SUB 130 between the cathode N+ region 146 and the trigger P+ region 143.

Including a gate structure instead of an STI region reduces input base resistance, which leads to higher efficiency triggering and an enhancement in switch turn on. For example, including the anode gate 171 provides enhanced surface conduction that reduces a resistance of the PNP base resistor Rnwx, and including the cathode gate 172 provides enhanced surface conduction that reduces a resistance of the NPN base resistor Rpwx.

Although FIG. 3 illustrates an embodiment including both the anode and cathode gate structures, the teachings herein are also applicable to implementations including the anode gate structure and omitting the cathode gate structure, and to implementations including the cathode gate structure and omitting the anode gate structure.

The anode gate 171 and the cathode gate 172 can be controlled in a wide variety of ways. For example, voltage of the anode gate 171 and the cathode gate region 172 can be biased with a DC voltage, left electrically floating, or dynamically biased via an active control circuit. By controlling the gate voltage of the anode gate 171 and cathode gat 172, the channel resistance beneath the gate can be tuned. For example, low channel resistance enhances turn-on speed of the latch-up suppression switch.

As shown in FIG. 3, the gate dielectric 173 is included between the anode gate 171 and the NW 131, and the gate dielectric 174 is included between the cathode gate 172 and the P-SUB 130. In certain implementations, the gates include polysilicon, and the gate dielectric includes an oxide, such as Silicon dioxide.

Figure 4A:
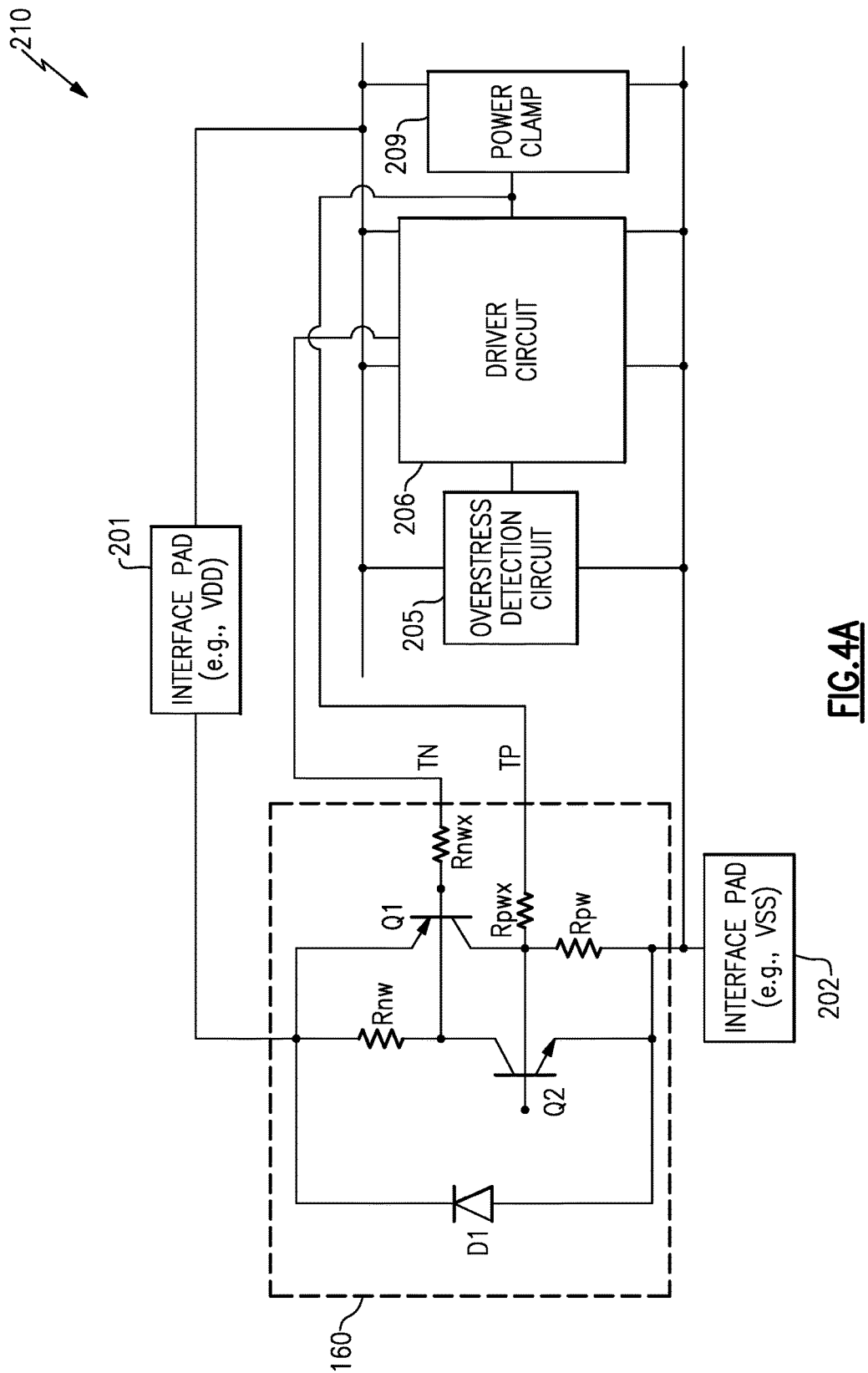
FIG. 4A is a schematic diagram of an IC interface according to one embodiment.

FIG. 4A is a schematic diagram of an IC interface 210 according to one embodiment. The IC interface 210 includes a first interface pad 201, a second interface pad 202, an electrical overstress detection circuit 205, a driver circuit 206, a power clamp 209, and a latch-up suppression switch 160.

Although the IC interface 210 of FIG. 4A illustrates one example of an IC interface that can include one or more latch-up suppression switches, the teachings herein are applicable to a wide variety of IC interfaces. Accordingly, other implementations are possible.

The electrical overstress detection circuit 205, the driver circuit 206, the power clamp 209, and the latch-up suppression switch 160 are each electrically connected between the first interface pad 201 and the second interface pad 202. In certain implementations, the first interface pad 201 is a supply voltage pad VDD, and the second interface pad 202 is a ground voltage pad VSS. However, other implementations are possible. For example, a latch-up suppression switch can be connected to voltage rails of different potential, for instance, between a first supply voltage and a second supply voltage.

In the illustrated embodiment, the electrical overstress detection circuit 205 monitors the first interface pad 201 and the second interface pad 202 to determine whether or not a transient electrical overstress event is present. In certain configurations, the electrical overstress detection circuit 205 detects a rate of voltage change between the first interface pad 201 and the second interface pad 202, and activates a transient overstress detection signal when a qualifying transient electrical overstress event is detected. However, the electrical overstress detection circuit 205 can monitor for an electrical overstress condition based on a multitude of detection conditions indicative of the potential of electrical overstress to damage sensitive electronics, including, but not limited to, measurements of power, voltage, current, and/or charge.

The driver circuit 206 processes the transient overstress detection signal from the electrical overstress detection circuit 205 to generate trigger signals that control one or more latch-up suppression switches, such as the latch-up suppression switch 160.

Although the illustrated driver circuit 206 generates two trigger signals, a driver circuit can generate more or fewer trigger signals from a transient overstress detection signal. Moreover, the teachings herein are applicable to implementations in which a driver circuit is omitted in favor of using an electrical overstress detection circuit to directly control the triggering of one or more latch-up suppression switches. The electrical overstress detection circuit 205 also generates a clamp activation signal that controls activation of the power clamp 209, in this embodiment.

When the IC interface 210 operates with normal voltage levels or conditions, the latch-up suppression switch 160 operates in an OFF state. However, in response to the electrical overstress detection circuit 205 detecting the presence of a transient electrical overstress event, trigger signals are activated to lower the latch-up suppression switch's activation and holding voltages.

Thus, the latch-up suppression switch 160 begins in a low-leakage/high-impedance OFF state. Upon detection of a transient electrical overstress event, the electrical overstress detection circuit 205 activates a transient overstress detection signal, which the driver circuit 206 processes to activate trigger signals that result in the latch-up suppression switch 160 transitioning to a high-current/low-impedance ON state. When the trigger signals are activated, the latch-up suppression switch 160 operates with lower activation and holding voltages, and thus turns on to clamp the first interface pad 201 to the second interface pad 202.

Accordingly, while the trigger signals are activated, the latch-up suppression switch 160 has enhanced conductivity and selectively decreased activation and holding voltages. After the transient electrical overstress event has passed, the electrical overstress detection circuit 205 deactivates the transient overstress detection signal, which results in deactivation of the trigger signals and the latch-up suppression switch 160 returning to the low-leakage/high-impedance OFF state.

The latch-up suppression switch 160 operates during powered conditions of the IC interface 210. In one embodiment, when the trigger signals are activated, the activation and holding voltages of the latch-up suppression switch 160 are less than the nominal voltage difference between the first interface pad 201 and the second interface pad 202 such that the latch-up suppression switch 160 turns on. Additionally, when the trigger signals are deactivated, the activation and holding voltages of the latch-up suppression switch 160 are greater than the nominal voltage difference between the first interface pad 201 and the second interface pad 202 such that the latch-up suppression switch 160 turns off.

The latch-up suppression switch 160 provides voltage clamping that reduces a likelihood that nearby mixed-signal circuits succumb to a latch-up condition. Since the latch-up suppression switch 160 is actively controlled via trigger signals, the latch-up suppression switch 160 can operate with a rapid turn on time.

Figure 4B:
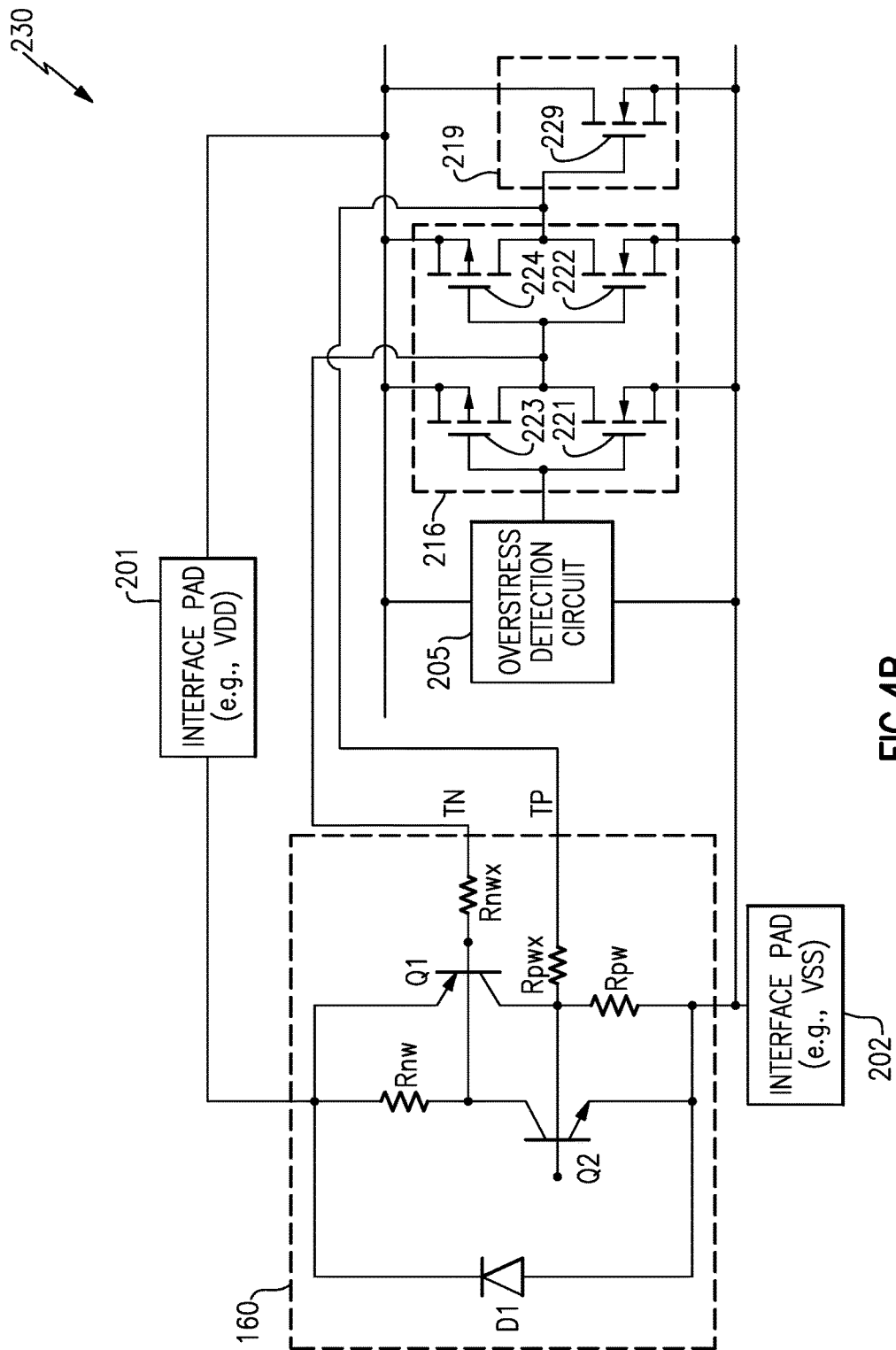
FIG. 4B is a schematic diagram of an IC interface according to another embodiment.

FIG. 4B is a schematic diagram of an IC interface 230 according to another embodiment. The IC interface 230 of FIG. 4B is similar to the IC interface 210 of FIG. 4A, except that the IC interface 230 illustrates specific implementations of a driver circuit 216 and of a power clamp 219.

In particular, the driver circuit 216 of FIG. 4B includes a first inverter including a first NMOS transistor 221 and a first PMOS transistor 223, and a second inverter including a second NMOS transistor 222 and a second PMOS transistor 224. The first inverter logically inverts the transient overstress detection signal from the electrical overstress detection circuit 205 to generate a first trigger signal for the latch-up suppression switch 160, and the second inverter logically inverts the first trigger signal to generate a second trigger signal for the latch-up suppression switch 160.

The driver circuit 216 also controls a gate of an NMOS clamp transistor 229 of the power clamp 219. Thus, in certain implementations, a trigger signal also serves as a clamp activation signal for a power clamp.

Using multiple driver stages (for instance, two or more MOS inverter stages) can accelerate detection control and provide suitable current conduction strength for driving the bases of bipolar transistors of one or more latch-up suppression switches. However, other implementations are possible.

The drive strengths of the first and second inverters can be selected based on a wide variety of criteria, including, but not limited to, a number of switches that receive the trigger signals, a processing technology, and/or parasitics associated with conductors used to route the trigger signals. In one embodiment, a width to length (W/L) ratio is selected to be in the range of about 20 to 200 for the PMOS transistors 223-224, and in the range of about 15 to 80 for the NMOS transistors 221-222. However, other implementations are possible.

Figure 4C:
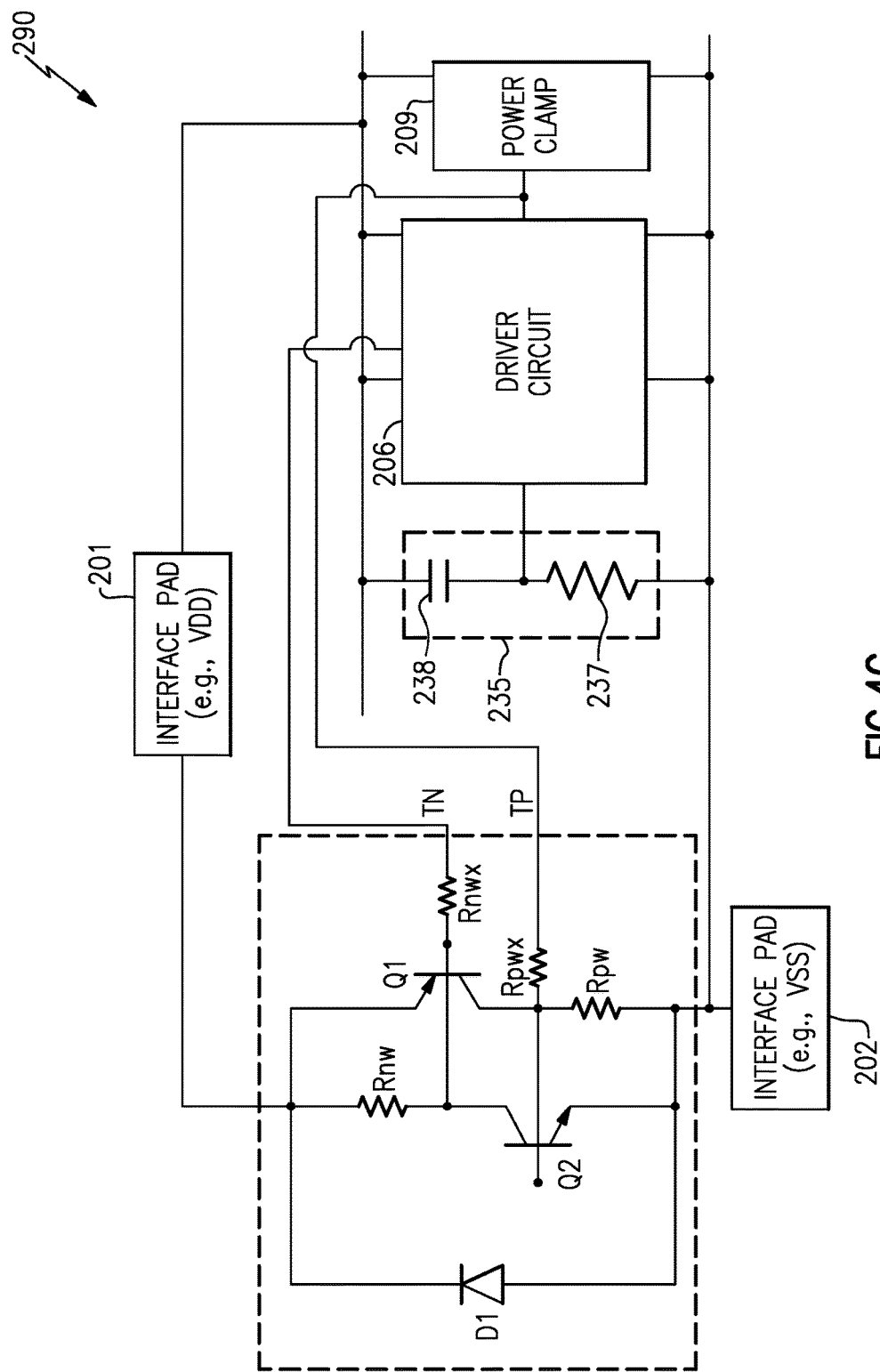
FIG. 4C is a schematic diagram of an IC interface according to another embodiment.

FIG. 4C is a schematic diagram of an IC interface 290 according to another embodiment. The IC interface 290 of FIG. 4C is similar to the IC interface 210 of FIG. 4A, except that IC interface 210 illustrates a specific implementation of an electrical overstress detection circuit 235.

In particular, the illustrated overstress detection circuit 235 includes a detection capacitor 238 and a detection resistor 237 electrically connected in series between the first interface pad 201 and the second interface pad 202. Additionally, an intermediate node between the detection capacitor 238 and a detection resistor 237 is used to generate the transient overstress detection signal provided to the driver circuit 206.

The detection capacitor 238 and the detection resistor 237 serve to detect for presence of overstress based on a rate and duration of voltage change between the first interface pad 201 and the second interface pad 202. When a qualifying electrical overstress event is present, the transient overstress detection signal is temporarily activated, and turns off after a time delay that is based on a time constant of the detection capacitor 238 and the detection resistor 237.

Although one example of an electrical overstress detection circuit is shown in FIG. 4C, an electrical overstress detection circuit can be implemented in a wide variety of ways.

Figure 4D:
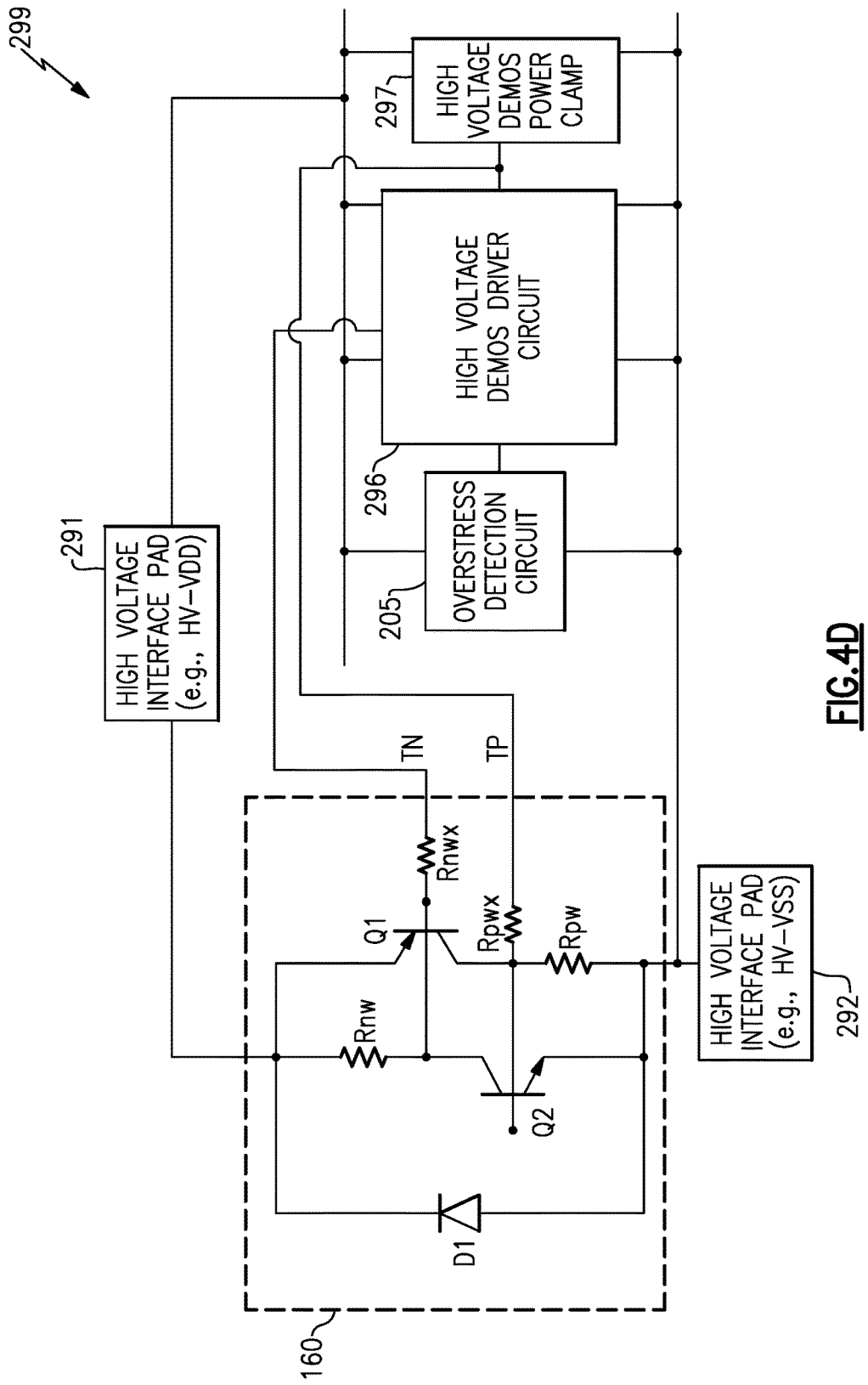
FIG. 4D is a schematic diagram of an IC interface according to another embodiment.

FIG. 4D is a schematic diagram of an IC interface 299 according to another embodiment. The IC interface 299 includes a first high voltage interface pad 291, a second high voltage interface pad 292, an electrical overstress detection circuit 205, a high voltage drain-extended metal oxide semiconductor (DEMOS) driver circuit 296, a high voltage DEMOS power clamp 297, and a latch-up suppression switch 160.

In certain implementations, an integrated circuit includes one or more power supplies that are high voltage tolerant. In the illustrated embodiment, the IC interface 299 includes the DEMOS power clamp 297, which is operable to withstand a high voltage difference between the first high voltage interface pad 291 and the second high voltage interface pad 292. Additionally, the high voltage DEMOS driver circuit 296 has been included to provide trigger signals to the latch-up suppression switch 160. By including DEMOS transistors in the driver circuit and/or power clamp, enhanced tolerance to high voltages can be obtained.

High voltage circuitry refers to circuitry that operates at a higher voltage than low voltage circuitry. In one specific example, a low voltage circuit operates with a voltage of less than about 8 V, a high voltage circuit operates with a voltage in the range of about 8 V to about 30 V. Although one specific example of low voltage and high voltage has been provided, other voltage ranges and values are possible, such as voltages that depend on transistor gate oxide capabilities and/or breakdown voltages associated with a particular manufacturing process.

Figure 5:
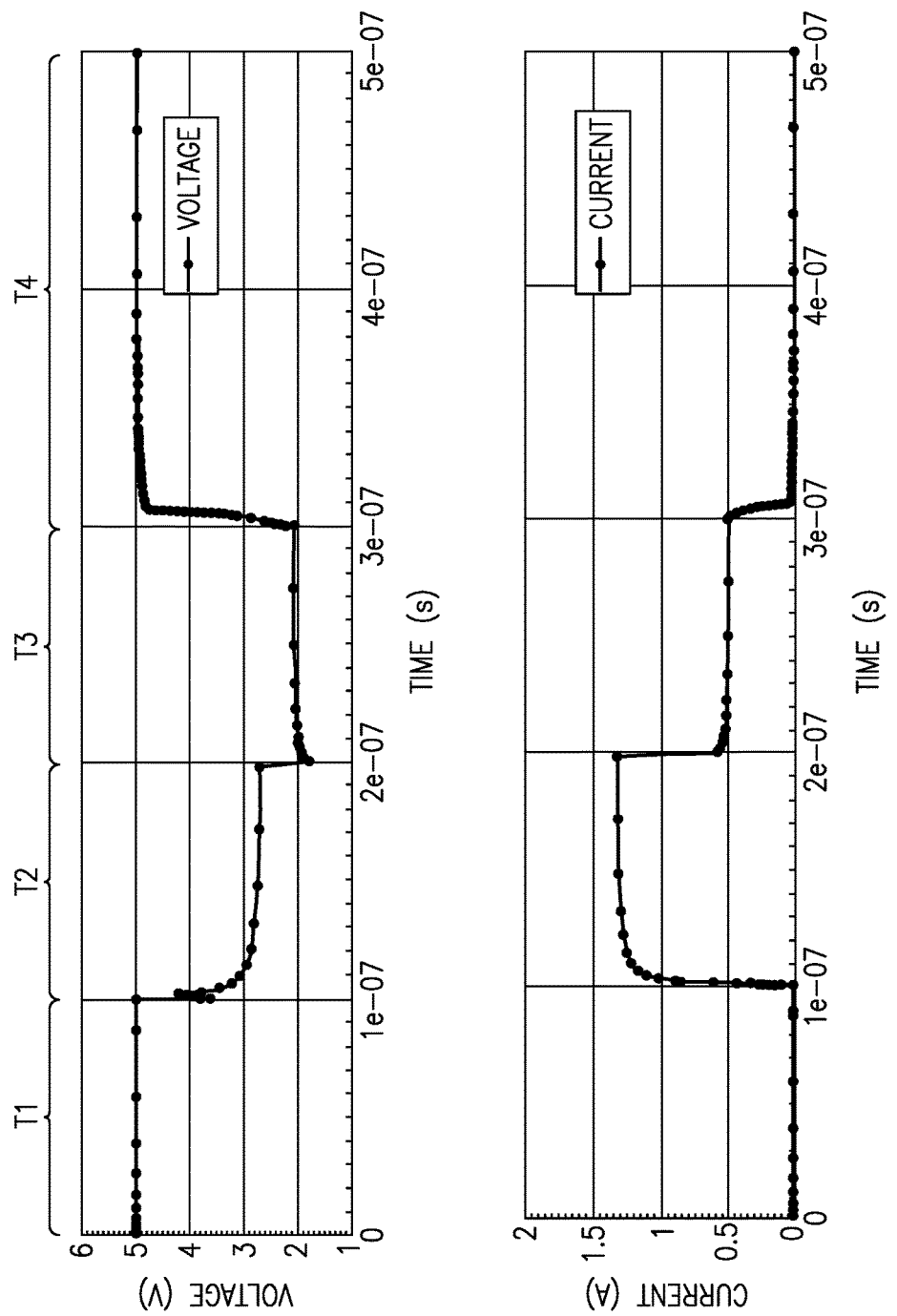
FIG. 5 is a graph of electrical overstress simulation results for one implementation of distributed latch-up suppression switches.

FIG. 5 is a graph of electrical overstress simulation results for one implementation of distributed latch-up suppression switches. The graph includes a plot of voltage versus time and a plot of current versus time. The simulation corresponds to one implementation of the IC 100 of FIG. 1.

The simulation includes a first time period T1 in which power is provided to a supply voltage rail and a ground rail, but prior to arrival of a transient electrical overstress event. In this example, the nominal voltage difference between the power rails is about 5 V.

With continuing reference to FIG. 5, the simulation further includes a second time period T2 in which a transient electrical overstress event is present. The transient electrical overstress event begins at a time of about 0.1 µs and ends at a time of about 0.2 µs. As shown in FIG. 5, the latch-up suppression switches turn on in response to detection of an electrical overstress condition to clamp the power rail and the ground rail.

The simulation further includes a third time period T3 in which the transient electrical overstress event has passed, but in which the trigger signals remain activated. The trigger signals can remain activated until an electrical overstress detection circuit determines that a transient electrical overstress event is no longer present.

With continuing reference to FIG. 5, the simulation further includes a fourth time period T4 in which the trigger signals are deactivated. As shown in FIG. 5, the latch-up suppression switches turn off in response to deactivation of the trigger signals, and the power rails return to normal voltage levels.

By turning on the distributed latch-up suppression switches in response to detection of an electrical overstress condition, little to no risk of latch-up is provided. As shown in FIG. 5, the latch-up suppression switches are turned on and off efficiently and relatively quickly. Additionally, the latch-up suppression switches are activated in response to electrical overstress to clamp the power rails, and subsequently released such that the power rails return to normal voltage levels.

Figure 6A:
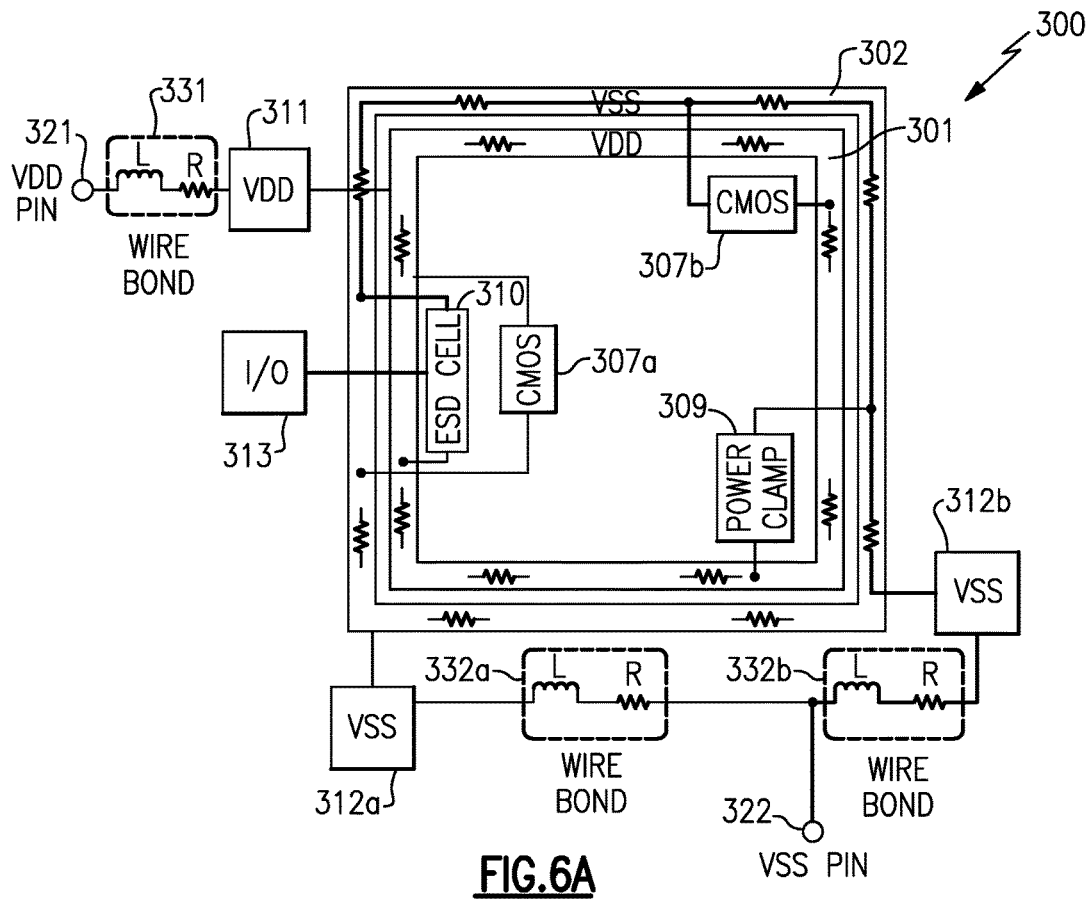
FIG. 6A is a schematic diagram of one example of an IC susceptible to electrical overstress events.

FIG. 6A is a schematic diagram of one example of an IC 300 susceptible to electrical overstress events. The IC 300 includes a first power rail 301, a second power rail 302, a first CMOS core mixed-signal circuit 307a, a second CMOS core mixed-signal circuit 307b, a power clamp 309, an ESD protection cell 310, a power supply pin 311, a first ground pin 312a, a second ground pin 312b, and an input/output (I/O) or signal pin 313. FIG. 6A has also been annotated to show certain structures present after the IC 300 is packaged, including a package supply voltage pin 321, a package ground pin 322, a supply voltage bond wire 331, a first ground bond wire 332a, and a second ground bond wire 332b.

Figure 6B:
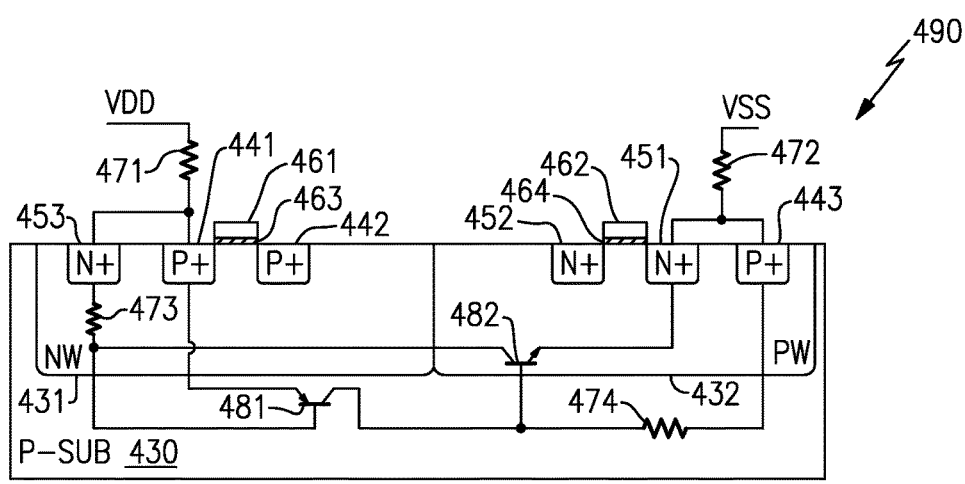
FIG. 6B is an annotated cross-section of one example of a CMOS inverter layout that can be included in the CMOS mixed-signal circuitry of FIG. 6A.

FIG. 6B is an annotated cross-section of one example of a CMOS inverter layout 490 that can be included in the CMOS core mixed-signal circuitry of FIG. 6A. For example, one or more instantiations of the CMOS inverter layout 490 can be included in the first CMOS core mixed-signal circuit 307a and/or the second CMOS core mixed-signal circuit 307b.

The CMOS inverter layout 490 is formed in a p-type substrate (P-SUB) 430, and includes an n-type well (NW) 431, a p-type well (PW) 432, a source p-type active (P+) region 441, a drain P+ region 442, a body P+ region 443, a source n-type active (N+) region 451, a drain N+ region 452, a body N+ region 453, a PMOS gate 461, PMOS gate dielectric 463, an NMOS gate 462, and NMOS gate dielectric 464.

As shown in FIG. 6B, the source P+ region 441 and the body N+ region 453 receive a supply voltage VDD via metallization, and the source N+ region 451 and the body P+ region 443 receive a ground voltage VSS via metallization. Although not illustrated in FIG. 6B for clarity of the figures, the NMOS gate 461 and the PMOS gate 462 are connected to an input terminal of the CMOS inverter layout 490, and the drain P+ region 442 and the drain N+ region 452 are connected to an output terminal of the CMOS inverter layout 490.

The CMOS inverter layout 490 has been further annotated to show certain circuit devices present in the cross-section, including a parasitic PNP bipolar transistor 481, a parasitic NPN bipolar transistor 482, an NW resistor 473, a PW resistor 474, a supply voltage resistor 471, and a ground resistor 472.

The parasitic PNP bipolar transistor 481 includes an emitter formed from the source P+ region 441, a base formed from the NW 431, and a collector formed from the PW 432. Additionally, the parasitic NPN bipolar transistor 482 includes an emitter formed from the source N+ region 451, a base formed from the PW 432, and a collector formed from the NW 431. The parasitic PNP bipolar transistor 481 and the parasitic NPN bipolar transistor 482 are cross-coupled to form a parasitic SCR that can undesirably latch-up in response to electrical overstress.

For example, a transient electrical overstress event can induce a displacement current that is injected into the P-SUB 430 via the NW 431 and the PW 432. The injected current can lead to triggering of the parasitic SCR.

Figure 6C:
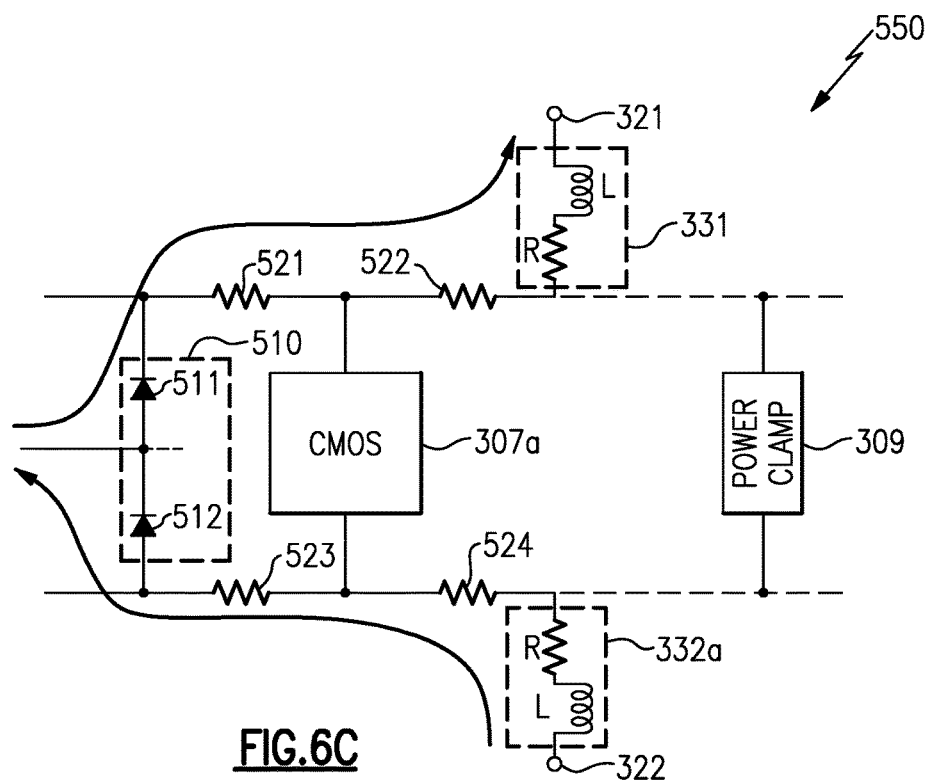
FIG. 6C is a schematic diagram of one example of an IC interface for the IC of FIG. 6A.

FIG. 6C is a schematic diagram of one example of an IC interface 550 for the IC 300 of FIG. 6A. The IC interface 550 includes the CMOS core mixed-signal circuit 307a, the power clamp 309, the package supply voltage pin 321, the package ground pin 322, the supply voltage bond wire 331, and the ground bond wire 332a, which were described above with reference to FIG. 6A. The IC interface 550 further includes an ESD protection cell 510, which corresponds to one implementation of the ESD protection cell 310 of FIG. 6A.

As shown in FIG. 6C, certain package-level and IC-level parasitic effects are shown. For example, the IC interface 550 is annotated to show certain parasitics associated with the IC's power supply network, including a bond wire resistor R, a bond wire inductor L, a first supply voltage resistor 521, a second supply voltage resistor 522, a first ground resistor 523, and a second ground resistor 524.

When a transient electrical overstress event is present, the power supply parasitics can lead to overvoltage and/or high current injection that can lead to latch-up in the CMOS core mixed-signal circuit 307*a*. The CMOS core mixed-signal circuit 307*a* can be particularly sensitive to latch-up, as the CMOS core mixed-signal circuit 307*a* can include CMOS gates (for instance, instantiations of the CMOS inverter layout 490 of FIG. 6B) that may not be laid out to prevent latch-up, for instance, when subject to relatively high electromagnetic compatibility (EMC)-type stress current.

For example, in response to a transient electrical overstress event, current can flow through a first diode 511 and/or a second diode 512 of the ESD protection cell 310. The current flow can lead to IR voltage drop associated with parasitic resistors. Moreover, voltage changes can lead to L*dv/dt currents associated with parasitic inductors. Absent a protection scheme, the large currents and voltages can lead to latch-up in the CMOS core mixed-signal circuit 307*a*.

Thus, a transient electrical overstress event can lead to rapid overvoltage conditions and/or large currents, which can cause latch-up and junction breakdown in a short time period. Although the power clamp 309 can activate to clamp an IC's power rails, the power clamp 309 can be located a relatively far distance away from the CMOS core mixed-signal circuit 307*a*, and intervening parasitics can lead to local levels of high voltage and/or current. Moreover, a response time of the power clamp 309 can be too slow, and thus voltage overshoot and/or high currents can be present shortly after arrival of a transient electrical overstress event.

By including distributed latch-up suppression switches in the IC, latch-up risk is reduced or eliminated. For example, the latch-up suppression switches inhibit electrical overstress from causing large currents to be injected into CMOS layouts and/or limit overvoltage of power rails that provide a supply voltage and a ground voltage to nearby CMOS core mixed-signal circuitry. The latch-up suppression switches are actively controlled to operate with fast turn-on, and thus can provide latch-up protection even when the power clamp 309 or other ESD protection device with large current handling capability has yet to be activated. Additionally, the latch-up suppression switches can be implemented with relatively small footprint or layout area, and thus are suitable for integration near or in the layouts of CMOS core mixed-signal circuits.

Figure 6D:
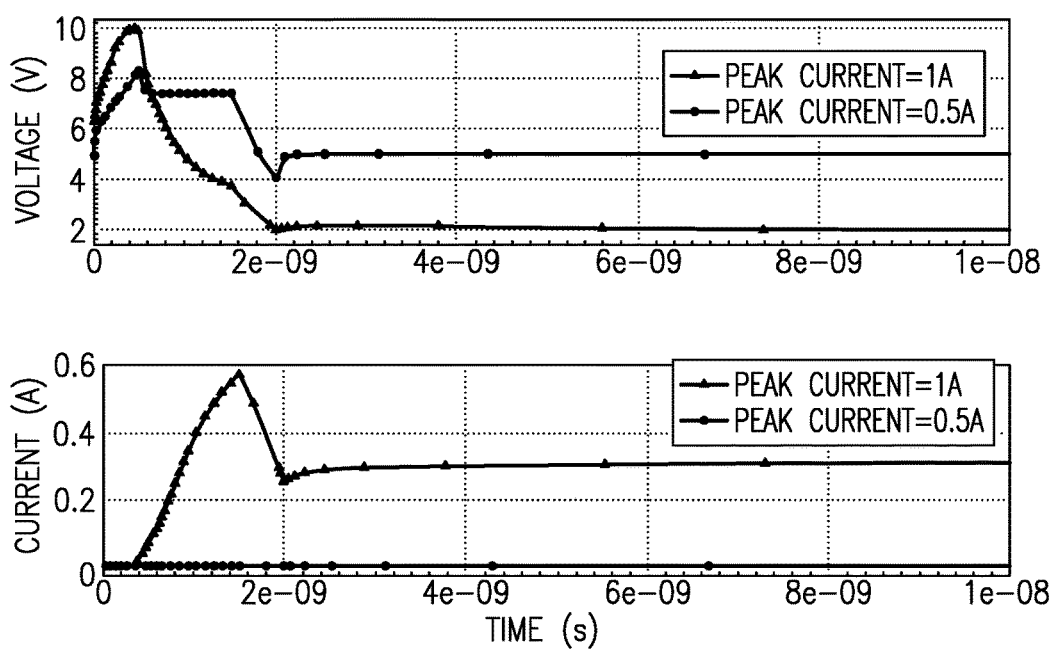
FIG. 6D is a graph of one example of electrical overstress-induced latch-up simulations for the IC interface of FIG. 6C.

FIG. 6D is a graph of one example of electrical overstress-induced latch-up simulations for the IC interface 550 of FIG. 6C.

The simulations correspond to one implementation of the IC interface 550 of FIG. 6C in which parasitic inductances each have a value of 1 nH and the parasitic resistors each have a value of 2.5Ω. Additionally, the transient electrical overstress event has a pulse rise time of 100 ps and a pulse width of 1 ns. Two simulation results are illustrated, one in which the transient electrical overstress event has a peak current of 0.5 A and another in which the transient electrical overstress event has a peak current of 1 A.

As shown in FIG. 6D, when latch-up suppression switches are omitted, latch-up can occur in response to even relatively small amounts of electrical overstress.

Devices employing the above-described schemes can be implemented into various electronic devices. Examples of the electronic devices can include, but are not limited to, consumer electronic products, parts of the consumer electronic products, electronic test equipment, communication infrastructure applications, etc. Further, the electronic device can include unfinished products, including those for communication, industrial, medical and automotive applications.

Terms such as above, below, over and so on refer to a device orientated as shown in the figures and should be construed accordingly. It should also be appreciated that because regions within a semiconductor device are defined by doping different parts of a semiconductor material with differing impurities or differing concentrations of impurities, discrete physical boundaries between different regions may not actually exist in the completed device but instead regions may transition from one to another. Some boundaries of this type and are illustrated as abrupt structures merely for the assistance of the reader. As persons having ordinary skill in the art will appreciate, p-type regions can include a p-type semiconductor material, such as boron, as a dopant. Furthermore, n-type regions can include an n-type semiconductor material, such as phosphorous, as a dopant. Persons having ordinary skill in the art will appreciate various concentrations of dopants in regions described above.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An integrated circuit with distributed latch-up suppression, the integrated circuit comprising:
    a first power rail;
    a second power rail;
    a first electrical overstress detection circuit configured to activate a first transient overstress detection signal in response to detecting a transient electrical overstress event between the first power rail and the second power rail;
    a first driver circuit configured to buffer the first transient overstress detection signal to generate a first pair of trigger signals including a first trigger signal and a second trigger signal that are logically inverted relative to one another;
    a plurality of complementary metal oxide semiconductor (CMOS) circuits powered by the first power rail and the second power rail and distributed across the integrated circuit; and
    a first plurality of thyristors electrically connected between the first power rail and the second power rail, wherein when the integrated circuit is powered, the first plurality of thyristors are operable to clamp the first power rail and the second power rail in response to activation of the first pair of trigger signals so as to inhibit latch-up of the plurality of CMOS circuits, and to release in response to deactivation of the first pair of trigger signals.

2. The integrated circuit of claim 1 wherein a first thyristor of the first plurality of thyristors comprises an NPN bipolar transistor and a PNP bipolar transistor that are cross-coupled, wherein a base of the PNP bipolar transistor is configured to receive the first trigger signal and a base of the NPN bipolar transistor is configured to receive the second trigger signal.

3. The integrated circuit of claim 1, further comprising a power clamp electrically connected between the first power rail and the second power rail and operable to turn on in response to activation of the second trigger signal.

4. The integrated circuit of claim 1, wherein the first electrical overstress detection circuit comprises a detection capacitor and a detection resistor electrically connected in series between the first power rail and the second power rail.

5. The integrated circuit of claim 2, wherein the first thyristor operates with a first activation voltage and a first holding voltage when the first pair of trigger signals are deactivated, and with a second activation voltage and a second holding voltage when the first pair of trigger signals are activated.

6. The integrated circuit of claim 5, wherein the first activation voltage and the first holding voltage are greater than a nominal voltage difference between the first power rail and the second power rail, and wherein the second activation voltage and the second holding voltage are less than the nominal voltage difference.

7. The integrated circuit of claim 2, wherein the first thyristor comprises a P+ anode region serving as an emitter of the PNP bipolar transistor, an N+ cathode region serving as an emitter of the NPN bipolar transistor, an N+ trigger region configured to receive the first trigger signal, and a P+ trigger region configured to receive the second trigger signal.

8. The integrated circuit of claim 7, wherein the N+ trigger region and the P+ trigger region are positioned between the P+ anode region and the N+ cathode region.

9. The integrated circuit of claim 8, wherein the first thyristor further comprises a first gate structure between P+ anode region and the N+ trigger region, and a second gate structure between N+ anode region and the P+ trigger region.

10. The integrated circuit of claim 7, wherein the first thyristor further comprises a diode having an anode electrically connected to the emitter of the NPN bipolar transistor and a cathode electrically connected to the emitter of the PNP bipolar transistor.

11. The integrated circuit of claim 3, wherein the power clamp comprises an n-type metal oxide semiconductor (NMOS) clamp transistor having a drain electrically connected to the first power rail, a source electrically connected to the second power rail, and a gate configured to receive the second trigger signal.

12. The integrated circuit of claim 1, further comprising a second electrical overstress detection circuit configured to activate a second transient overstress detection signal in response to detecting the transient electrical overstress event, a second driver circuit configured to buffer the second transient overstress detection signal to generate a second pair of trigger signals, and a second plurality of thyristors electrically connected between the first power rail and the second power rail and controlled by the second pair of trigger signals.

13. A method of inhibiting latch-up in an integrated circuit, the method comprising:
powering a mixed-signal circuit using a first power rail and a second power rail;
activating a transient overstress detection signal in response to detecting a transient electrical overstress event between the first power rail and the second power rail;
buffering the transient overstress detection signal to generate a pair of trigger signals including a first trigger signal and a second trigger signal that are logically inverted relative to one another;
clamping the first power rail and the second power rail by turning on a plurality of thyristors in response to activation of the pair of trigger signals to thereby inhibit latch-up in the mixed-signal circuit; and
releasing the plurality of thyristors in response to deactivation of the pair of trigger signals.

14. The method of claim 13, further comprising operating the plurality of thyristors with a first activation voltage and a first holding voltage when the pair of trigger signals are deactivated, and with a second activation voltage and a second holding voltage when the pair of trigger signals are activated.

15. The method of claim 14, wherein the first activation voltage and the first holding voltage are greater than a nominal voltage difference between the first power rail and the second power rail, and wherein the second activation voltage and the second holding voltage are less than the nominal voltage difference.

16. An interface for a semiconductor chip, the interface comprising:
a first interface pad;
a second interface pad;
an electrical overstress detection circuit configured to activate a transient overstress detection signal in response to detecting a transient electrical overstress event between the first interface pad and the second interface pad;
a driver circuit configured to buffer the transient overstress detection signal to generate a pair of trigger signals including a first trigger signal and a second trigger signal that are logically inverted relative to one another;
a mixed-signal circuit configured to receive power from the first interface pad and the second interface pad; and
a plurality of thyristors electrically connected between the first interface pad the second interface pad, wherein the plurality of thyristors are operable to clamp the first interface pad and the second interface pad in response to activation of the pair of trigger signals to inhibit latch-up of the mixed-signal circuit, and to release in response to deactivation of the pair of trigger signals.

17. The interface of claim 16, wherein a first thyristor of the plurality of thyristors comprises an NPN bipolar transistor and a PNP bipolar transistor that are cross-coupled, wherein a base of the PNP bipolar transistor is configured to receive the first trigger signal and a base of the NPN bipolar transistor is configured to receive the second trigger signal.

18. The interface of claim 17, wherein the first thyristor operates with a first activation voltage and a first holding voltage when the pair of trigger signals are deactivated, and with a second activation voltage and a second holding voltage when the pair of trigger signals are activated.

19. The interface of claim 18, wherein the first activation voltage and the first holding voltage are greater than a nominal voltage difference between the first interface pad and the second interface pad, and wherein the second activation voltage and the second holding voltage are less than the nominal voltage difference.

20. The interface of claim 17, wherein the first thyristor comprises a P+ anode region serving as an emitter of the PNP bipolar transistor, an N+ cathode region serving as an emitter of the NPN bipolar transistor, an N+ trigger region configured to receive the first trigger signal, and a P+ trigger region configured to receive the second trigger signal.

* * * * *

UNITED STATES PATENT AND TRADEMARK OFFICE
CERTIFICATE OF CORRECTION

PATENT NO. : 10,404,059 B2
APPLICATION NO. : 15/428535
DATED : September 3, 2019
INVENTOR(S) : Javier Alejandro Salcedo Page 1 of 1

It is certified that error appears in the above-identified patent and that said Letters Patent is hereby corrected as shown below:

In the Specification

Column 2, Line 12, after "first interface pad" insert --and--.

In the Claims

Column 18, Line 48, in Claim 16, after "first interface pad" insert --and--.

Signed and Sealed this
Tenth Day of December, 2019

Andrei Iancu
*Director of the United States Patent and Trademark Office*